(12) United States Patent
Maki

(10) Patent No.: US 6,501,694 B2
(45) Date of Patent: Dec. 31, 2002

(54) PRECHARGE CIRCUIT WITH SMALL WIDTH

(75) Inventor: Yasuhiko Maki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/972,943

(22) Filed: Oct. 10, 2001

(65) Prior Publication Data

US 2002/0126555 A1 Sep. 12, 2002

(30) Foreign Application Priority Data

Mar. 12, 2001 (JP) ........................................ 2001-068063

(51) Int. Cl.[7] ................................................. G11C 7/00
(52) U.S. Cl. ........................................ 365/203; 365/190
(58) Field of Search ................................ 365/203, 190, 365/184.01, 189.03, 189.08

(56) References Cited

U.S. PATENT DOCUMENTS

| | | | | |
|---|---|---|---|---|
| 5,418,749 A | * | 5/1995 | Suda et al. .................. | 365/203 |
| 5,491,435 A | * | 2/1996 | Mun et al. .................... | 327/51 |
| 6,275,429 B1 | * | 8/2001 | Bae et al. .................... | 365/203 |
| 6,333,881 B1 | * | 12/2001 | Kusunoki et al. ........... | 365/154 |

FOREIGN PATENT DOCUMENTS

| | | | | |
|---|---|---|---|---|
| JP | 361126683 A | * | 6/1986 | |
| JP | 3-209690 | | 9/1991 | |
| JP | 410214484 A | * | 8/1998 | |

* cited by examiner

*Primary Examiner*—Richard Elms
*Assistant Examiner*—Hien Nguyen
(74) *Attorney, Agent, or Firm*—Arent Fox Kintner Plotkin & Kahn, PLLC

(57) ABSTRACT

Precharge circuits comprises PMOS transistors Q6 and Q7 each connected between a bit line and a power source potential VDD, PMOS transistors Q2, Q5, Q8 and Q11 connected between respective bit line pairs, and PMOS transistors Q21 and Q23 connected between respective adjacent bit lines of adjacent bit line pairs, wherein the gate electrodes of the PMOS transistors are each connected to a precharge control signal line PCG. The defect caused by omission of transistors from the prior art circuits is compensated by the PMOS transistors Q21 and Q23, each of which is required to be provided for two bit line pairs. With this and transistors of adjacent unit precharge circuits are arranged in plain symmetry, there is no need to provide transistors to be directly connected between bit lines *B2 and B3, and an average number of PMOS transistors for each bit line pair is less than 2.5.

10 Claims, 6 Drawing Sheets

PRECHARGE CIRCUIT WITH SMALL WIDTH

BACKGROUND OF THE INVENTION

1. Field of the Invention

The present invention relates generally to a precharge circuit for charging a pair of complementary signal lines to the same potential prior to generation of a potential difference between the pair of complementary signal lines by a given potential, more particularly, to a precharge circuit for charging a bit line pair in an static random access memory (SRAM) circuit.

2. Description of the Related Art

FIG. 6(B) shows part of a precharge circuit and a memory cell array of a prior art SRAM circuit. Hereinafter, symbols X and *X generally denote complementary signal lines. In order to precharge bit lines B1 and *B1 by a power source potential VDD prior to read from and write to a 4 transistor memory cell MC1, a PMOS transistor Q2 is connected between the bit lines B1 and *B1, a PMOS transistor Q1 is connected between the bit line B1 and the power source potential VDD, and a PMOS transistor Q3 is connected between the bit line *B1 and the power source potential PCG.

For example, in a case where the bit lines B1 and *B1 are at high and low potential levels, respectively, and when a precharge control signal line PCG is driven high, currents flow from the power source potential VDD through the PMOS transistor Q3 to the bit line *B1, from the bit line B1 through the PMOS transistor Q2 to the bit line *B1, from the power source potential VDD through the PMOS transistor Q1 to the bit line B1, and from the power source potential VDD through the PMOS transistors Q1 and Q2 to the bit line *B1 such that the bit lines B1 and *B1 goes to the power source potential VDD. This applies to precharge operation on other bit line pairs in similar manner.

FIG. 6(A) shows a layout of transistors and contacts thereto of the precharge circuit of FIG. 6(B).

The bit lines B1 and *B1 formed in a metal wiring layer above the transistors are connected through contacts BIC and *BIC to P type regions 11 and 12, respectively, each in common to adjacent PMOS transistors. The power supply line VDD formed in a power supply line layer above the transistors is connected through respective contacts C1 and C2 to P type regions 13 and 14 each in common to adjacent PMOS transistors.

The gate electrodes 15 to 17 of the respective PMOS transistors Q1 to Q3 are parallel to each other, so the P type regions of sufficient spaces can be ensured between the gate electrodes to realize high speed precharge with decreasing in resistance of each transistor which is on. Further, short circuits between the gate electrodes in device fabrication can be prevented.

In recent memory devices, a memory cell pitch has been narrowed in company with a high storage density, and design rules adopted in a memory cell array have been stricter in comparison with those of peripheral circuitry. Hence a three transistor width $W1=3d$, where d is a transistor pitch, of a precharge circuit cannot be confined within the memory cell pitch, with the result that realization of higher storage density in memory circuit is hindered.

When such a problem arose before the quarter micron technology, the three transistor width W1 of the precharge circuit was able to be narrowed by the use of bent gate electrodes in transistors of the precharge circuit. After the quarter micron technology, however, such a layout has been practically impossible since a space between adjacent bent gate electrodes is narrower with not only increasing resistance of transistors which are on, but also decreasing a product yield due to short circuits generated in device fabrication.

A precharge circuit with two transistors is disclosed in JP 3-209690 A, which is obtained by omitting a transistor connected between one bit line of a bit line pair and the power source potential VDD in the above described precharge circuit with three transistors.

However, by omitting the transistor, when a bit line on the omitted transistor side is at a low level, a precharge speed with driving this bit line to a high level is reduced, resulting in a longer memory access time.

SUMMARY OF THE INVENTION

Accordingly, it is an object of the present invention to provide a precharge circuit capable of suppressing a reduction in a precharge speed with a smaller width thereof.

In one aspect of the present invention, there is provided a precharge circuit for precharging first and second signal lines to a given potential, comprising: first and second switching transistors connected between a first end side of the first signal line and the given potential and between a second end side of the second signal line and the given potential, respectively; and third and fourth switching transistors connected between the first and second signal lines at the first end side and at the second end side, respectively.

According to this configuration, since the number of switching transistors in each of precharge circuits at first and second end sides of one signal line pair is two, a width in a direction perpendicular to the signal lines can be narrower than that of the prior art precharge circuit having three switching transistors at one side of the signal line pair, thereby enabling higher storage density in memory circuit.

Further, although a switching transistor between a second signal line and a given potential is omitted at a first end side of the second signal line, a switching transistor is not omitted at a second end side of the second signal line and likewise, although a switching transistor between a first signal line and the predetermined potential is omitted at the second end side of the first signal line, a switching transistor is not omitted at the first end side of the first signal line; therefore, a reduction in precharge speed due to omission of the switching transistors can be suppressed.

In another aspect of the present invention, there is provided a precharge circuit for precharging a plurality of signal line pairs to a given potential, comprising: a first switching transistor connected between one signal line of each of the signal line pairs and the given potential; a second switching transistor connected between signal lines of each of the signal line pairs; and a third switching transistor connected between adjacent signal lines of adjacent pairs of the signal line pairs.

According to this configuration, since the defect caused by omitting the above-described transistors is compensated by the third switching transistors for causing all the bit lines to be conductive therebetween, reduction in precharge speed is suppressed. Further, since one third transistor is added between each adjacent signal line pairs, an average number of switching transistors for each signal line pair is 2.5 and therefore, a width in a direction perpendicular to the signal lines can be narrower than that of the prior art having three switching transistors for each signal line pair, thereby enabling a higher storage density in memory circuit.

Other aspects, objects, and the advantages of the present invention will become apparent from the following detailed description taken in connection with the accompanying drawings.

DESCRIPTION OF THE PREFERRED EMBODIMENTS

Figure 1:
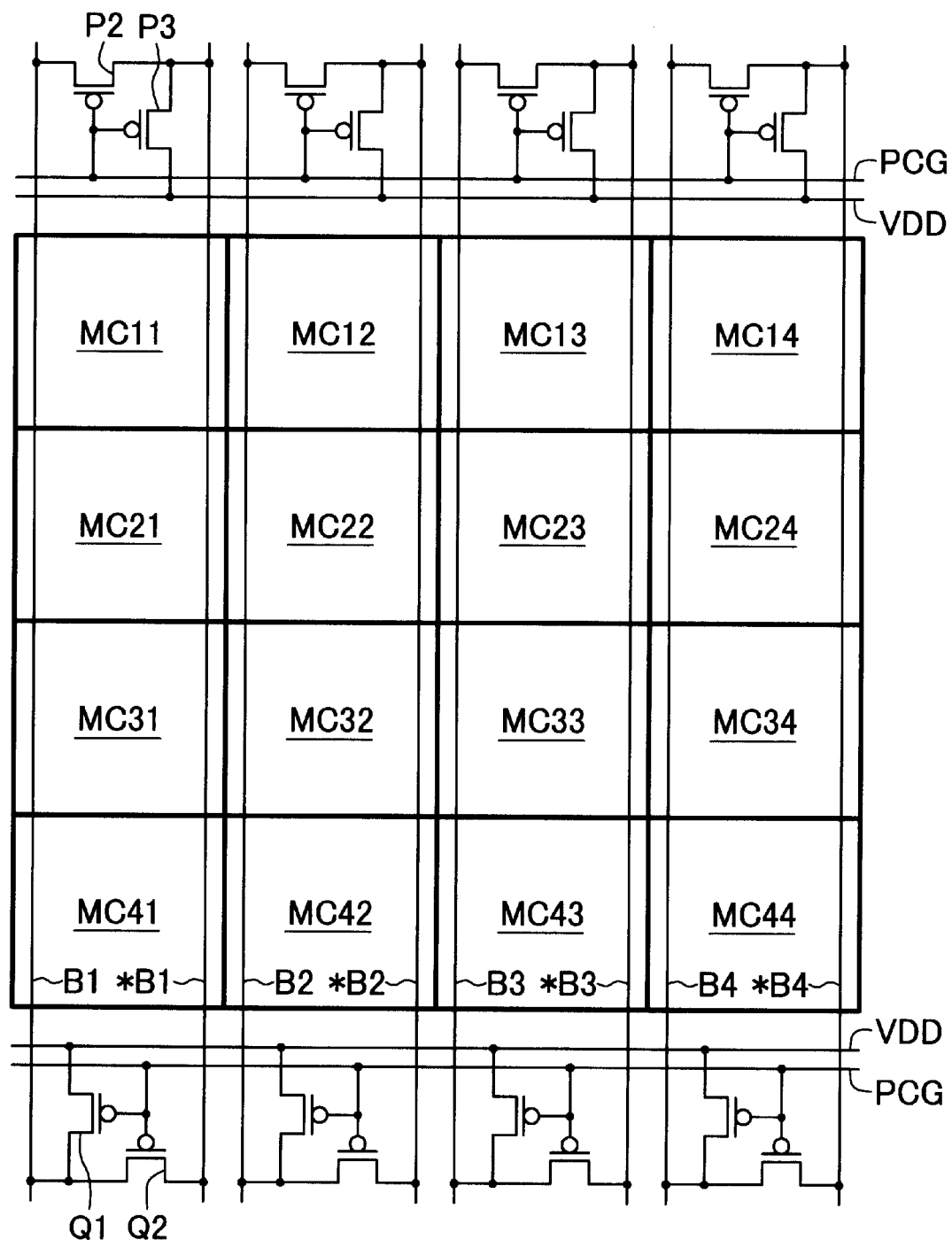
FIG. 1 is a diagram showing precharge circuits applied to a memory cell array, of a first embodiment according to the present invention.

Referring now to the drawings, wherein like reference characters designate like or corresponding parts throughout several views, preferred embodiments of the present invention are described below.

First Embodiment

FIG. 1 shows precharge circuits applied to a memory cell array, of a first embodiment according to the present invention. In FIG. 1, for the sake of simplification, each of memory cells MC11 to MC44 with 4 rows and 4 columns is expressed by a block.

Bit lines B1 to B4 and *B1 to *B4 are for use in read and write of bit data, and bit line pairs are provided to respective columns of the memory cell array. Precharge circuits for each bit line pair are provided at both ends thereof.

In respect of the bit lines B1 and *B1 of a first bit line pair, PMOS transistors Q1 and P3 are respectively connected between one end of the bit line B1 and a power source potential VDD, and between the other end of the bit line *B1 and the power source potential VDD, while PMOS transistors Q2 and P2 are respectively connected between the bit lines B1 and *B1 at the one and the other ends. The gates of the PMOS transistors Q1, Q2, P2 and P3 are all connected to a precharge control signal line PCG.

This applies to each of the other bit line pairs in a similar manner.

Next, description will be given of operation of the circuit configured as described above.

Prior to selection of a memory cell row, the precharge control line PCG is driven high for a predetermined time to perform precharge on all bit lines simultaneously.

For example, in a case where the bit lines B1 and *B1 are high and low, respectively, by data read in a previous time, when the precharge control line PCG goes high, currents flow from the bit line B1 through each of the PMOS transistors Q2 and P2 to the bit line *B1, from the power source potential VDD through the PMOS transistor P3 to the bit line *B1, and from the power source potential VDD through the PMOS transistors Q1 and Q2 to the bit line *B1 so as to raise the potential of the bit line *B1 up to VDD. When the potential of the bit line B1 is going to fall by flow of a current from the bit line B1 through each of the PMOS transistors Q2 and P2 to the bit line *B1, currents flow from the power source potential VDD through the PMOS transistor Q1 to the bit line B1 and from the power source potential VDD through the PMOS transistors P3 and P2 to the bit line B1 so as to compensate the reduction in the potential of the bit line B1. In such a way, the bit lines B1 and *B1 become the power source potential VDD. This applies to each of the other bit line pairs in a similar manner.

In the first embodiment, since a precharge circuit at each end of a bit line pair is constructed of two transistors, a width in a direction perpendicular to the bit lines can be narrower than that of the prior art precharge circuit having three transistors, thereby enabling a higher storage density in memory circuit.

Further, although a transistor between the bit line *B1 and the power source potential VDD is omitted at the one end side of the bit line *B1, a transistor is not omitted at the other end side of the bit line *B1, and likewise, although a transistor between the bit line B1 and the power source potential VDD is omitted at the other end side of the bit line B1, a transistor is not omitted on the one end side of the bit line B1; therefore, reduction in precharge speed due to omission of transistors is suppressed.

Second Embodiment

Figure 2:
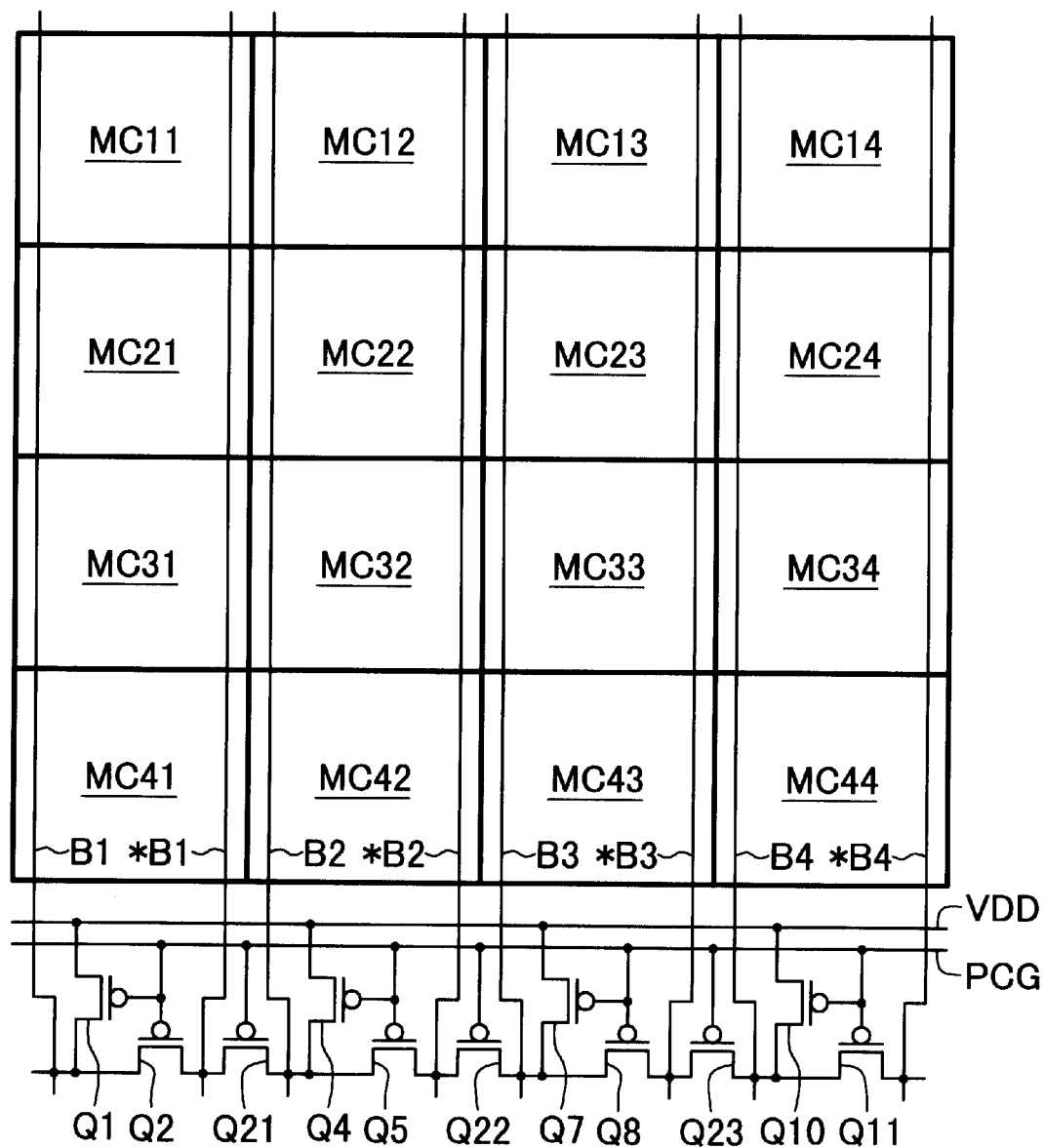
FIG. 2 is a diagram showing precharge circuits applied to a memory cell array, of a second embodiment according to the present invention.

FIG. 2 shows precharge circuits applied to a memory cell array, of a second embodiment according to the present invention.

These precharge circuits are formed only at one end sides of the bit line pairs. A transistor between the power source potential VDD and one of a bit line pair is omitted in a similar manner to a precharge circuit at one end side of a bit line pair of FIG. 1. A transistor for equalizing adjacent bit lines of adjacent bit line pairs during precharge is connected therebetween in order to compensate the reduction of a precharge speed caused by omission of the transistor with smaller number of transistors as a whole. That is, PMOS transistors Q21 to Q23 are respectively connected between bit lines *B1 and B2, between bit lines *B2 and B3, and between bit lines *B3 and B4. The gate of the PMOS transistors Q21 to Q23 are all connected to the precharge control line PCG in a manner similar to the other transistors.

When the precharge control signal line PCG goes high, all the transistors of the precharge circuits are turned on. For example, the bit line *B1 becomes conductive not only to the bit line B1 through the PMOS transistor Q2, but also to the bit lines B2, *B2, B3, *B3, B4, and *B4, and further to the power source potential VDD through the PMOS transistor Q21 and other transistors; therefore, there arise an effect of suppressing reduction in precharge speed due to a transistor omitted between the bit line *B1 and the power source potential VDD.

Further, since the number of precharge transistors for each memory cell pitch is 2.5, a width of a precharge circuit can be narrower than in the prior art precharge circuit having three precharge transistors, thereby enabling a higher storage density in memory circuit.

Third Embodiment

Figure 3:
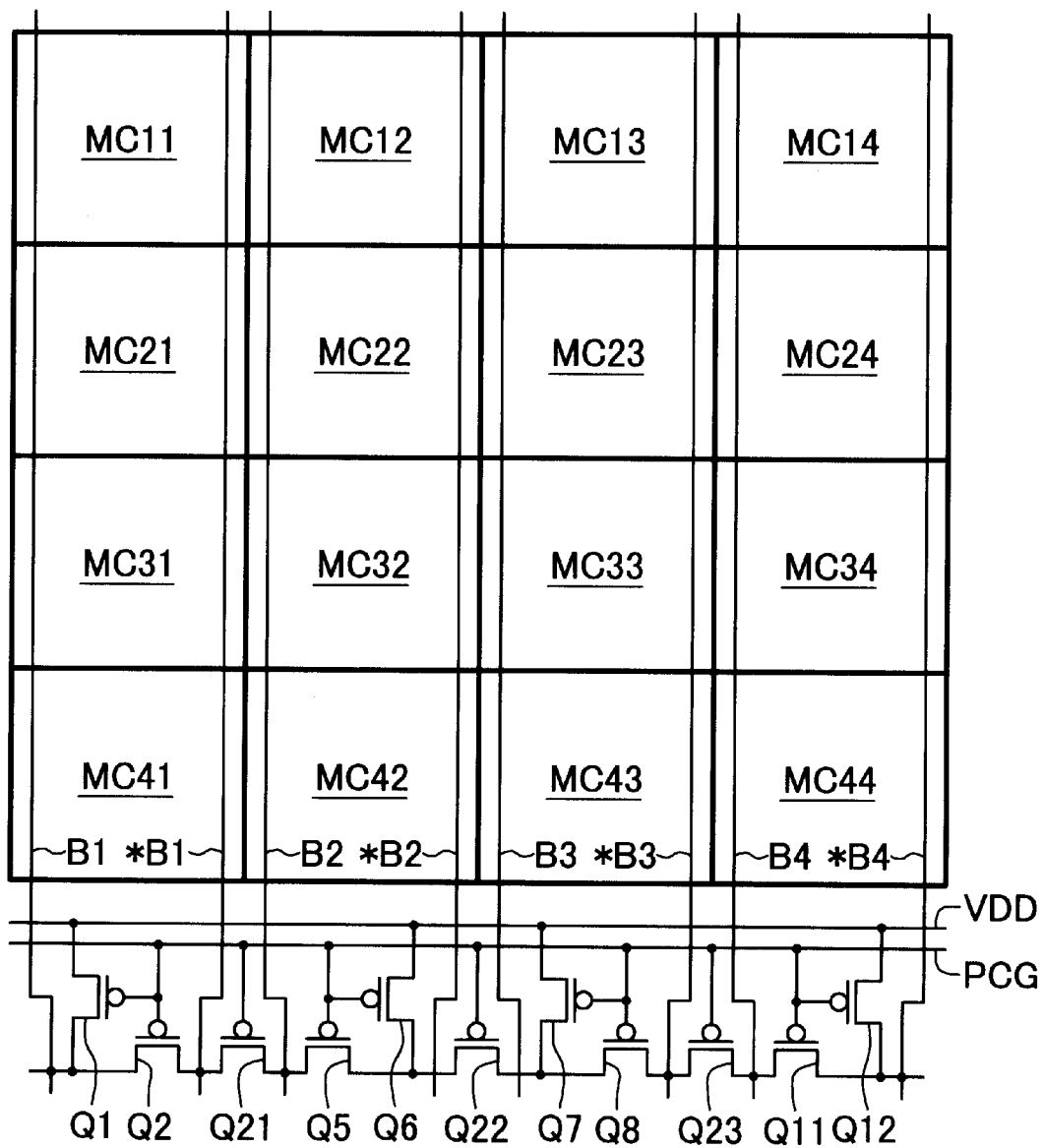
FIG. 3 is a diagram showing precharge circuits applied to a memory cell array, of a third embodiment according to the present invention.

FIG. 3 shows precharge circuits applied to a memory cell array, of a third embodiment according to the present invention.

These precharge transistors are the same as those of FIG. 2 in that not only is one transistor omitted for each of the bit line pairs, but also a equalize transistor is also connected between adjacent bit lines of adjacent bit line pairs.

A difference from the circuit of FIG. 2 is that transistors of both precharge circuits for adjacent bit line pairs are configured in symmetry with respect a boundary between memory cell columns. That is, transistors in unit precharge circuits at both sides of each of the PMOS transistors Q21 to Q23 are configured in symmetry.

With the third embodiment as well, effects similar to those of the second embodiment are obtained.

Fourth Embodiment

Figure 4:
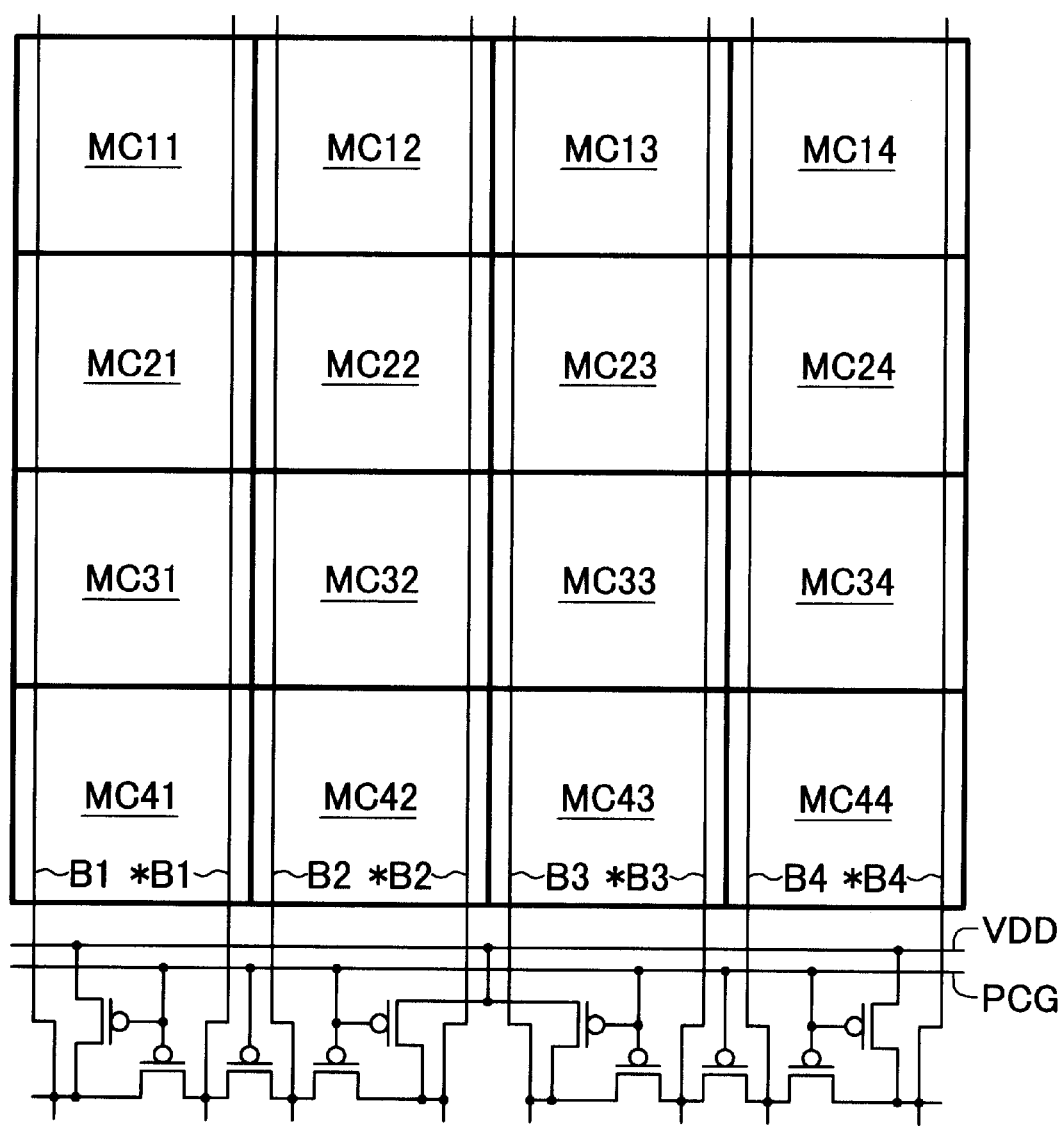
FIG. 4 is a diagram showing precharge circuits applied to a memory cell array, of a fourth embodiment according to the present invention.

FIG. 4 shows precharge circuits applied to a memory cell array, of a fourth embodiment according to the present invention.

In these precharge circuits,

In FIG. 3, since the PMOS transistors Q6 and Q7 provided at both sides of the PMOS transistor Q22 between adjacent bit lines of adjacent bit line pairs are respectively connected between one end of the PMOS transistor Q22 and the power source potential VDD and between the other end of the PMOS transistor Q22 and the power source potential VDD; therefore, even with omission of the equalize transistor Q22 used for compensating the defect caused by omission of transistors to be connected to the power source potential, an influence of the omitted equalize transistor Q22 is small. Hence, in FIG. 4, such a PMOS transistor Q22 is omitted.

Figure 5A:
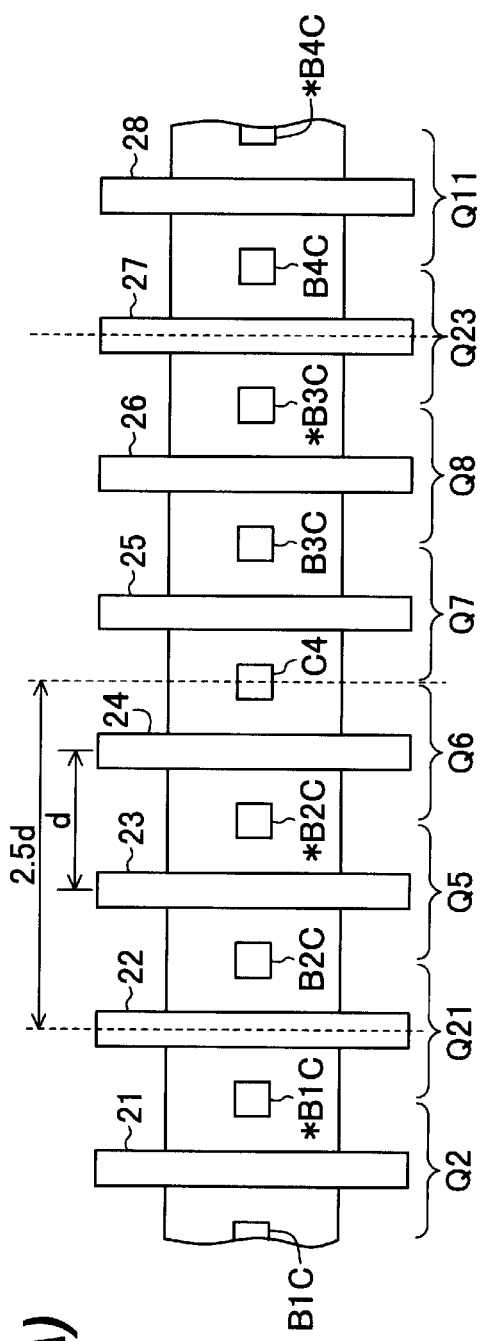
FIGS. 5a and 5b are diagrams showing a layout of transistors and contacts thereto of a precharge circuit of FIG. 4.
Figure 5B:
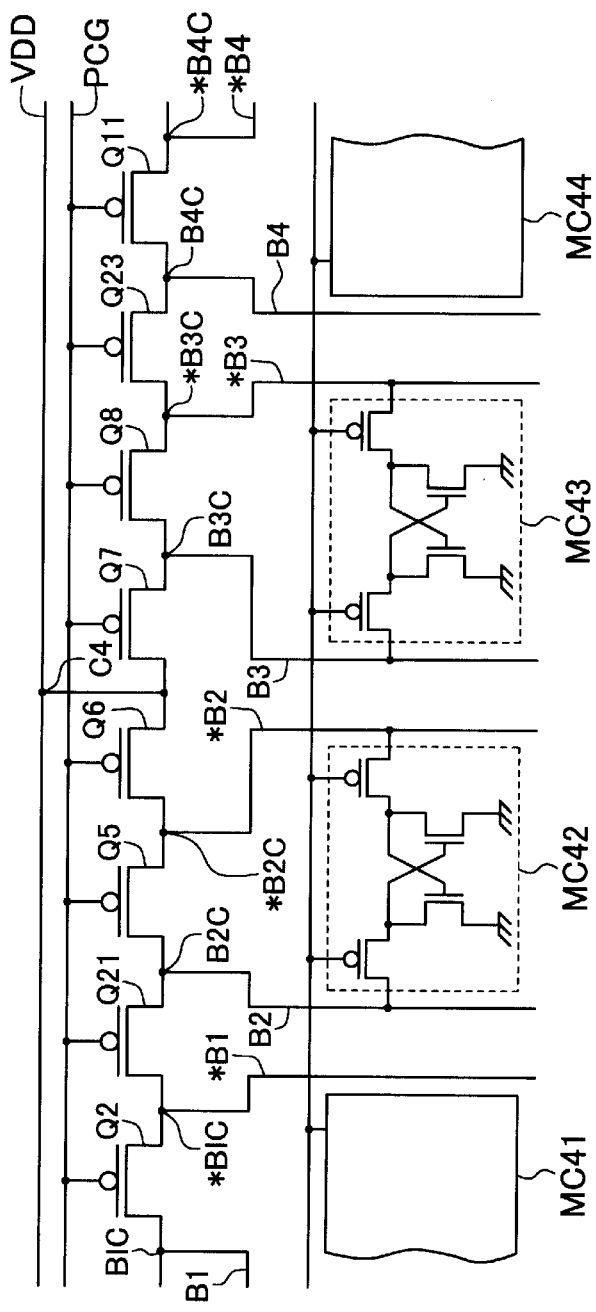

FIG. 5(A) shows a layout of transistors and contacts thereto of part of the precharge circuits of FIG. 4. FIG. 5(B) is a circuit diagram showing part of the precharge circuits and a memory cell array, corresponding to the layout of FIG. 4(A).

The bit lines B1 to B4 and *B1 to *B4 formed in a metal wiring layer above transistors are connected through respective contacts BIC to B4C and *B1C to *B4C each passing through a contact hole to respective P type regions each in common to adjacent transistors. The power supply line VDD is formed in a power supply line layer above transistors of the precharge circuits in parallel to the transistor row thereof, and is connected through a contact C4 to a P-type region which is in common to adjacent transistors. The gate electrodes 21 to 28 are constituents of the transistors of the precharge circuits.

Figures 6A, 6B:
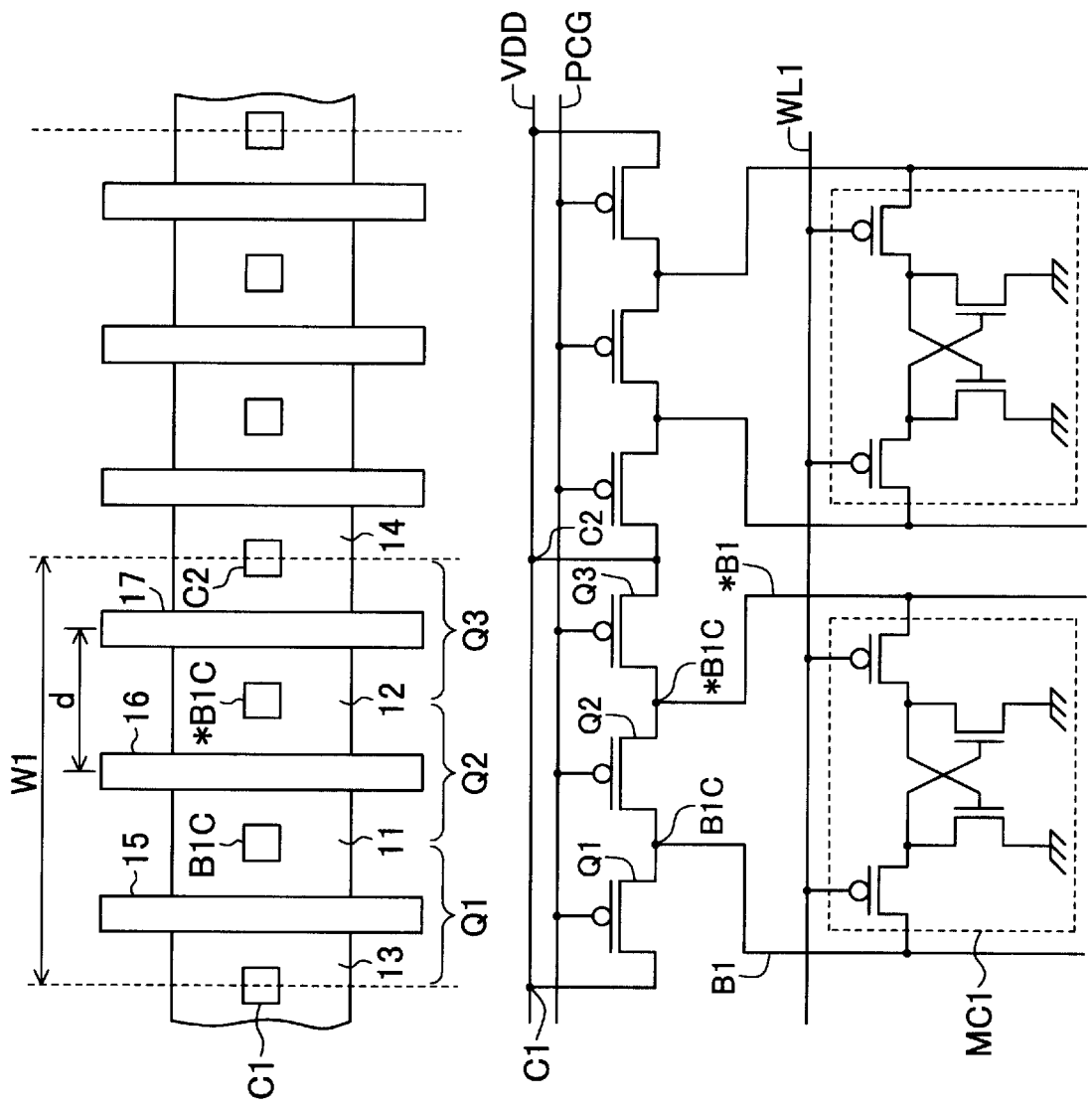
FIGS. 6a and 6b are diagrams showing part of a precharge circuits and a memory cell array of a prior art SRAM circuit.

According to the fourth embodiment, the transistors of the precharge circuits can be arranged in one row in a direction perpendicular to the bit line pairs in a similar way to FIG. 6(A), and furthermore the gate electrodes 21 to 28 of the transistors are arranged in parallel to each other; therefore, preventing increase in resistance of transistors which are on and decrease in product yield of semiconductor integrated circuit devices due to generation of short circuits in device fabrication caused by bending gate electrodes.

Further, a width of a precharge circuit for each bit line pair is 2.5 d in contrast to 3 d in the case of FIG. 6(A), thereby enabling a higher storage density in memory circuit.

Although preferred embodiments of the present invention has been described, it is to be understood that the invention is not limited thereto and that various changes and modifications may be made without departing from the spirit and scope of the invention.

For example, although in the above embodiments, description is given of a case where each memory cell of a SRAM circuit has four transistors, the present invention may be applied to a SRAM circuit of memory cells each having six transistors additionally including a cross-connected PMOS transistor pair. Further, the present invention can be applied to not only a SRAM circuit, but also various kinds of memory circuits and other circuits in which signal line pairs are precharged.

Moreover, precharge has only to be operation for causing signal line pairs to be at the same potential, e.g. a low level or an intermediate potential between low and high levels.

Further, a switching transistor has only to be one that can be on/off controlled and not limited to FET but may be a bipolar transistor.

What is claimed is:

1. A precharge circuit for precharging first and second signal lines to a given potential, comprising:

first and second switching transistors connected between a first end side of said first signal line and said given potential and between a second end side of said second signal line and said given potential, respectively; and third and fourth switching transistors connected between the first and second signal lines at said first end side and at said second end side, respectively, wherein no transistor is connected between the first end side of said second signal line and said given potential, and no transistor is connected between the second end side of said first signal line and said given potential.

2. A precharge circuit for precharging first and second signal line pairs to a given potential, each signal line pair comprising first and second signal lines, said precharge circuit comprising:

a first switching transistor connected between a first signal line of each signal line pair and said given potential;

a second switching transistor connected between first and second signal lines of each signal line pair; and a third switching transistor connected between adjacent two signal lines, one of said adjacent two signal lines being one signal line of said first signal line pair and the other of said adjacent two signal lines being one signal line of said second signal line pair.

3. The precharge circuit of claim 2, wherein a first set of said first and second switching transistors connected to said first signal line pair is symmetrically arranged to a second set of said first and second switching transistors connected to said second signal line pair, and either the first or second signal lines of said first and second signal line pairs are adjacently disposed to each other.

4. A precharge circuit for precharging first and second signal line pairs to a given potential, each signal line pair consisting of first and second signal lines, said precharge circuit comprising:

a first switching transistor connected between a first signal line of each signal line pair and said given potential; and a second switching transistor connected between first and second signal lines of each signal line pair, wherein said first signal lines of said first and second signal line pairs are adjacently disposed to each other and not connected to each other through another switching transistor, wherein a first set of said first and second switching transistors connected to said first signal line pair is symmetrically arranged to a second set of said first and second switching transistors connected to said second signal line pair.

5. The precharge circuit of claim 4, wherein said first and second sets of said first and second switching transistors are arranged in a row having a direction perpendicular to said first and second signal line pairs, and each adjacent two switching transistors of said first and second sets has a common electrode.

6. A semiconductor device on which a precharge circuit is formed, said precharge circuit being for precharging first and second signal lines to a given potential, said precharge circuit comprising:

first and second switching transistors connected between a first end side of said first signal line and said given potential and between a second end side of said second signal line and said given potential, respectively; and third and fourth switching transistors connected between the first and second signal lines at said first end side and at said second end side, respectively, wherein no transistor is connected between the first end side of said second signal line and said given potential, and no transistor is connected between the second end side of said first signal line and said given potential.

7. semiconductor device on which a precharge circuit is formed, said precharge circuit being for precharging first and second signal line pairs to a given potential, each signal line pair comprising first and second signal lines, said precharge circuit comprising:

a first switching transistor connected between one signal line of each of said signal line pairs and said given potential;

a second switching transistor connected between signal lines of each of said signal line pairs; and a third switching transistor connected between adjacent signal lines of adjacent pairs of said signal line pairs.

8. The semiconductor device of claim 7, wherein a first set of said first and second switching transistors connected to said first signal line pair is symmetrically arranged to a second set of said first and second switching transistors connected to said second signal line pair, and either the first or second signal lines of said first and second signal line pairs are adjacently dispose to each other.

9. A semiconductor device on which a precharge circuit is formed, said precharge circuit being for precharging first and second signal line pairs to a given potential, each signal line pair consisting of first and second signal lines, said precharge circuit comprising:

a first switching transistor connected between a first signal line of each signal line pair and said given potential; and a second switching transistor connected between first and second signal lines of each signal line pair, wherein said first signal lines of said first and second signal line pairs are adjacently disposed to each other and not connected to each other through another switching transistor, wherein a first set of said first and second switching transistors connected to said first signal line pair is symmetrically arranged to a second set of said first and second switching transistors connected to said second signal line pair.

10. The semiconductor device of claim 9, wherein said first to third switching transistors connected to each of said signal line pairs are arranged in a direction perpendicular to said signal line pairs, and adjacent electrodes of adjacent swithching transistors of said first to third switching transistors are in common.

* * * * *